United States Patent
Nijrolder (10) Patent No.: US 7,400,184 B2
(45) Date of Patent: Jul. 15, 2008

(54) CURRENT MODE MULTIPLIER BASED ON SQUARE ROOT VOLTAGE-CURRENT RELATIONSHIP OF MOS TRANSISTOR

(75) Inventor: Manjo Nijrolder, Oss (NL)

(73) Assignee: SiTel Semiconductor B.V. (NL)

( * ) Notice: Subject to any disclaimer, the term of this patent is extended or adjusted under 35 U.S.C. 154(b) by 57 days.

(21) Appl. No.: 11/112,581

(22) Filed: Apr. 22, 2005

(65) Prior Publication Data

US 2008/0036523 A1    Feb. 14, 2008

(51) Int. Cl.
G06F 7/44    (2006.01)
G06G 7/16    (2006.01)

(52) U.S. Cl. .................................. 327/359; 327/357
(58) Field of Classification Search ......... 327/355–359
See application file for complete search history.

(56) References Cited

U.S. PATENT DOCUMENTS

| | | | |
|---|---|---|---|
| 4,978,873 A | 12/1990 | Shoemaker | |
| 5,587,682 A | 12/1996 | Colli et al. | |
| 5,774,010 A | 6/1998 | Kimura | |
| 5,805,007 A | 9/1998 | Colli | |
| 5,966,040 A | 10/1999 | Gai et al. | |
| 6,100,741 A | 8/2000 | Ogawa et al. | |
| 6,242,965 B1 * | 6/2001 | Pickering et al. | 327/359 |
| 6,865,382 B2 * | 3/2005 | Behzad | 455/323 |
| 6,982,588 B1 * | 1/2006 | Lin et al. | 327/359 |
| 7,119,612 B1 * | 10/2006 | Holloway et al. | 330/9 |

OTHER PUBLICATIONS

Abdulkerim L. Coban et al., "A 1.5V Four-Quadrant Analog Multiplier", School of Electrical and Computer Engineering, Georgia Institute of Technology, 1995 IEEE, pp. 117-120.
Shuo-Yuan Hsiao et al., "A Parallel Structure for CMOS Four-Quadrant Analog Multiplier and Its Application to a 2-GHz RF Downconversion Mixer", IEEE Journal of Solid-State Circuits, vol. 33, No. 6, Jun. 1998, pp. 859-869.
Simon Cimin Li et al., "A±1.5V CMOS Four-Quadrant Analogue Multiplier Using 3GHz Analogue Squaring Circuits", Advanced Technology & Integrated System Laboratory (ATIS Lab.), Department of Humanity & Science National Yunlin University of Science and Technology, 1998 IEEE, pp. 347-350.
Zhenhua Wang, "A CMOS Four-Quadrant Analog Multiplier with Single-Ended Voltage Output and Improved Temperature Performance", IEEE Journal of Solid-State Circuits, vol. 26, No. 9, Sep. 1991, pp. 1293-1301.
Klaas Bult et al., "A CMOS Four-Quadrant Analog Multiplier", IEEE Journal of Solid-State Circuits, vol. Sc-21, No. 3, Jun. 1986, pp. 430-435.
Xiang-Luan Jia et al., "A New CMOS Analog Multiplier with Improved Input Linearity", Dept. Of Electronic Science, Nankai University, 1995 IEEE, pp. 135-136.
Klaas Bult et al., "A Class of Analog CMOS Circuits Based on the Square-Law Characteristic of an MOS Transistor in Saturation," IEEE Journal of Solid-State Circuits, vol. SC-22, No. 3, Jun. 1987, pp. 357-365.
M.A. Abou El-Atta et al., Four-Quadrant Current Multiplier and Its Application As A Phase-Detector, Nineteenth National Radio Science Conference, Alexandria, Mar. 19-21, 2002, 7 pages.
Gunhee Han et al., "CMOS Transconductance Multipliers: A Tutorial," IEEE Transactions on Circuits and Systems-II: Analog and Digital Signal Processing, vol. 45, No. 12, Dec. 1998, pp. 1550-1563.
Antonio J. Lopez-Martin et al., "Current-Mode Multiplier/Divider Circuits Based on the MOS Translinear Principle," Analog Integrated Circuits and Signal Processing, 28, 2001, pp. 265-278.

* cited by examiner

*Primary Examiner*—Quan Tra

(57) ABSTRACT

A current mode multiplier circuit is provided based on the square root voltage-current relationship of an MOS transistor. The circuit includes first, second and third MOS transistors with a common aspect ratio, and first and second current sources that respectively provide first and second input currents that represent first and second factors to be multiplied. The first and second MOS transistors produce first and second voltages as a function of the first and second input currents, and the third MOS transistor produces a third current as a function of the first and second voltages. In response to the third current, the circuit produces a product signal that represents a product of the first and second factors.

20 Claims, 9 Drawing Sheets

| SIZING | DESCRIPTION | MIN | TYPICAL | MAX | UNITY |
|---|---|---|---|---|---|
| V(pwrp) | Positive Supply Voltage | | 1.8 | | V |
| V(pwrm) | Negative Supply Voltage | | 0.0 | | V |
| W/Lx | Size M50, M51, M54, M55, M36, M37, M38, M39, M1, M2, M4, M5 | | 160/0.18 | | Micro Meter |
| W/Lx | Size M3, M6 | | 160/0.72 | | Micro Meter |
| $R_{0..3}$ | Resistance | | 4.0e3 | | ohm |
| $I_b$ | Bias Current of Current Sources M72, M76, M11, M12 | | 1000e-6 | | A |
| $I_{bo}$ | Bias Current of Current Sources M25, M27 | | 250e-6 | | A |

| SIZING | DESCRIPTION | MIN | TYPICAL | MAX | UNITY |
|---|---|---|---|---|---|
| V(pwrp) | Positive Supply Voltage | | 1.8 | | V |
| V(pwrm) | Negative Supply Voltage | | 0.0 | | V |
| V(cmin) | Common Mode Input Voltage | | 0.5 | | V |
| V(cmout) | Common Mode Output Voltage | | 0.9 | | V |
| R5 and R6 | Resistance | | 20e3 | | ohm |
| $C_{0..3}$ | Capacitor for Stability of I/V Converter | | 0.1 | | pf |
| $C_{4,5}$ | Load Capacitor | | 2.0 | | pf |
| $I_b$ | Bias Current for Multiplier "four_qm" | | 50e-6 | | A |
| $I_{bopamp}$ | Bias Current for Opamp | | 5.0e-6 | | A |
| Vin1 | Amplitude Input Signal 1 | | 0.1 | | V |
| fin1 | Frequency of Input Signal 1 | | 510 | | MHz |
| Vin2 | Amplitude Input Signal 2 | | 0.1 | | V |
| fin2 | Frequency of Input Signal 2 | | 500 | | MHz |

FIG. 8

FIG. 9

CURRENT MODE MULTIPLIER BASED ON SQUARE ROOT VOLTAGE-CURRENT RELATIONSHIP OF MOS TRANSISTOR

TECHNICAL FIELD OF THE INVENTION

The invention relates generally to analog multipliers and, more particularly, to current mode multipliers.

BACKGROUND OF THE INVENTION

Analog multipliers are useful components in various types of analog circuits. As analog circuit technology progresses, various circuit characteristics have become more desirable and/or mandatorily required. Examples of such characteristics include low circuit complexity, small circuit footprint, low supply voltage and high frequency operation.

It is desirable in view of the foregoing to provide analog multipliers that exhibit one or more of the aforementioned exemplary characteristics.

SUMMARY OF THE INVENTION

Exemplary embodiments of the invention provide a current mode multiplier circuit based on the square root voltage-current relationship of an MOS transistor. The circuit includes first, second and third MOS transistors with a common aspect ratio, and first and second current sources that respectively provide first and second input currents that represent first and second factors to be multiplied. The first and second MOS transistors produce first and second voltages as a function of the first and second input currents, and the third MOS transistor produces a third current as a function of the first and second voltages. In response to the third current, the circuit produces a product signal that represents a product of the first and second factors.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 10, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged system.

A four quadrant multiplier can be realized according to exemplary embodiments of the invention using the conditions: $I_b > 0$, $I_b > |i_{in1}| + |i_{in2}|$, and the following series expansion:

$$\sqrt{(I_b + i_{in1} - i_{in2}) \cdot (I_b - i_{in1} + i_{in2})} - \sqrt{(I_b + i_{in1} + i_{in2}) \cdot (I_b - i_{in1} - i_{in2})} = \quad (1)$$
$$2 \cdot \frac{i_{in1} \cdot i_{in2}}{I_b} + \frac{i_{in1} \cdot i_{in2}^3}{I_b^3} + \frac{i_{in1}^3 \cdot i_{in2}}{I_b^3} + 0(7)$$

$I_b$ represents a bias current, $i_{in1}$ and $i_{in2}$ are the input signal currents (which represent the factors to be multiplied), and 0(7) represents a truncation error of order 7. The wanted term is $$2 \cdot \frac{i_{in1} \cdot i_{in2}}{I_b}.$$

Each square-root term on the left-hand side is generated by the output current of a one quadrant square root multiplier (1QSRM). The difference current between two of these one quadrant multipliers provides the desired multiplication result (product).

Figure 1:
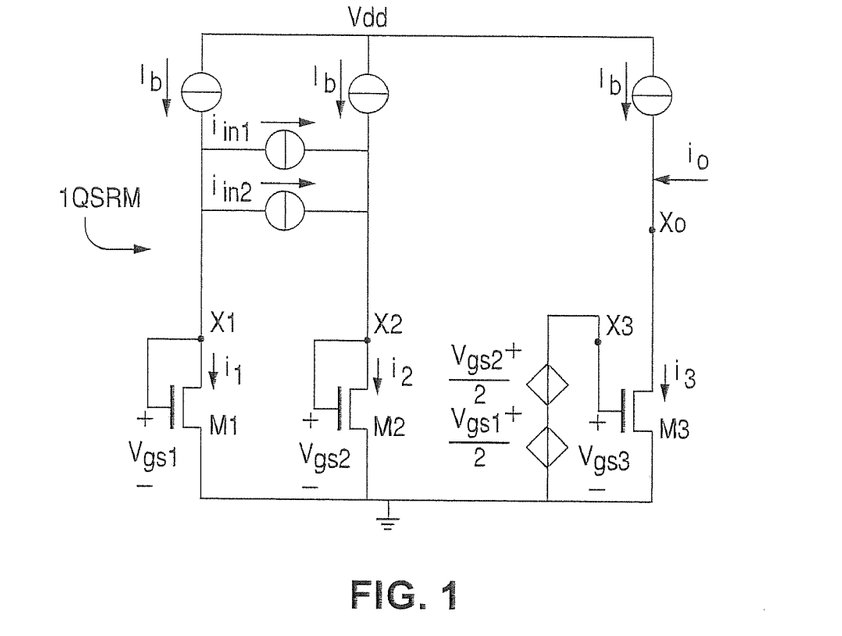
FIG. 1 diagrammatically illustrates a single quadrant square root current mode multiplier circuit according to exemplary embodiment of the invention.

A one quadrant square root multiplier (1QSRM) circuit according to exemplary embodiments of the invention is shown in FIG. 1. The MOS transistors M1, M2 and M3 are assumed to operate in saturation. Transistors M1 and M2 are diode connected. The input signal currents $i_{in1}$ and $i_{in2}$, and the bias current $I_b$, are provided by respectively corresponding current sources. The currents $i_1$ and $i_2$ through M1 and M2 respectively are $$i_1 = I_b - i_{in1} - i_{in2} \quad (2)$$

$$i_2 = I_b + i_{in1} + i_{in2}$$

All MOS transistors operate in saturation according to the square law characteristic of the MOS transistor. Furthermore, all MOS transistors have the same aspect ratio. The gate source voltages of M1 and M2 are:

$$V_{gs1} = V_T + \sqrt{\frac{i_1}{K}} \quad (3)$$

$$V_{gs2} = V_T + \sqrt{\frac{i_2}{K}}$$

wherein $V_T$ is the threshold voltage and K is the transconductance factor. The gate source voltages $V_{gs1}$ and $V_{gs2}$ are averaged and applied to the gate of MOS transistor M3, such that:

$$V_{gs3} = \frac{V_{gs1} + V_{gs2}}{2} \quad (4)$$

The resulting drain current i3 through M3 is therefore:

$$i_3 = K \cdot \left(\frac{V_{gs1}}{2} + \frac{V_{gs2}}{2} - V_T\right)^2 \quad (5)$$

Next, substitute for $V_{gs1}$ and $V_{gs2}$:

$$i_3 = K \cdot \left(\frac{1}{2}\sqrt{\frac{i_1}{K}} + \frac{1}{2}\sqrt{\frac{i_2}{K}}\right)^2 \text{ or} \quad (6)$$

$$i_3 = K \cdot \left(\frac{1}{4}\frac{i_1}{K} + \frac{1}{4}\frac{i_2}{K} + \frac{1}{2}\sqrt{\frac{i_2 \cdot i_2}{K \cdot K}}\right). \quad (7)$$

Finally, substitute for $i_1$ and $i_2$:

$$i_3 = \left(\frac{1}{2}I_b + \frac{1}{2}\sqrt{(I_b - i_{in1} - i_{in2}) \cdot (I_b + i_{in1} + i_{in2})}\right) \quad (8)$$

The constant part $I_b$ ($i_{in1}=0$, $i_{in2}=0$) is compensated for by the connection of the $I_b$ current source at the drain of M3. The output current $i_0$ is equal to $i_3 - I_b$, which is:

$$i_0 = \frac{1}{2}\sqrt{(I_b - i_{in1} - i_{in2}) \cdot (I_b + i_{in1} + i_{in2})} - \frac{1}{2}I_b \quad (9)$$

This is equal to half of one of the left hand side components of equation (1) minus a constant current $I_b/2$. Note that $i_0$ does not contain a processing-dependent factor.

Figure 2:
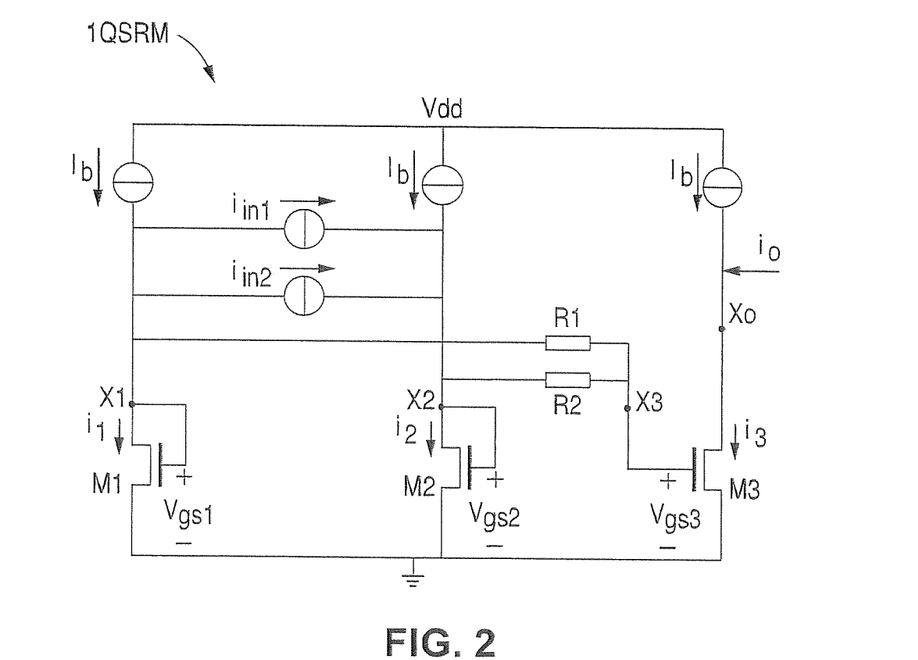
FIG. 2 illustrates a portion of FIG. 1 in more detail.

According to equation (4), the average of the voltages $V_{gs1}$ and $V_{gs2}$ is applied at the gate of M3. Some embodiments do this is using two resistors. With resistors, a simple implementation of the 1QSRM is possible, as shown in FIG. 2. By using equal resistor values (R1=R2), equation (4) is implemented.

The resistor R1 and R2 load the input current sources $i_{in1}$ and $i_{in2}$. The resistor R1 and R2 reduce the gain of the multiplier and cause the gain to depend on the process. The gain reduction of the multiplier can be approximated using the simplified small signal model of FIG. 3. Only M1 and M2 are modeled. Nodes X1 and X2 in FIG. 3 correspond to nodes X1 and X2 in FIGS. 1 and 2.

Figure 3:
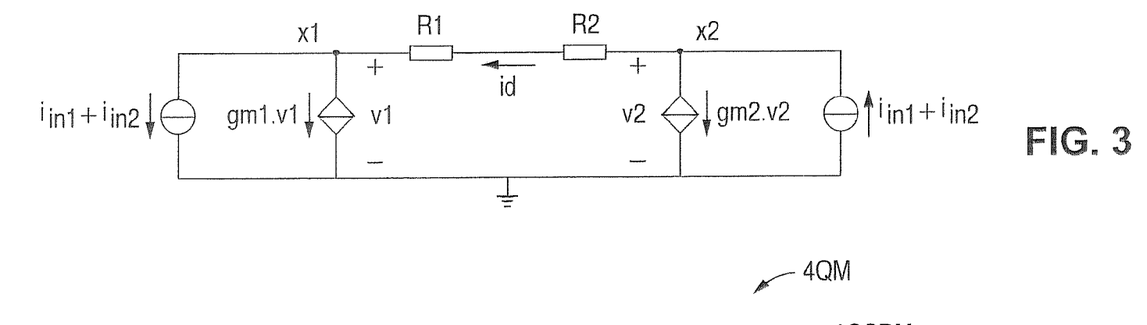
FIG. 3 diagrammatically illustrates a model which can be used to determine gain reduction in the multiplier circuits of FIGS. 1 and 2.

According to the simple square law MOS model, the small signal transconductance gmx equals:

$$gmx = 2 \cdot \sqrt{I_b K} \quad (10)$$

This indicates that the transconductance is processing dependent, but controlled by the bias current Ib. The difference current id equals:

$$id = (i_{in1} + i_{in2}) \cdot \left(\frac{\frac{1}{gm1} + \frac{1}{gm2}}{R1 + R2 + \frac{1}{gm1} + \frac{1}{gm2}}\right) \quad (11)$$

This difference current reduces the small signal drain-source current of MI and M2 by a factor "r":

$$r = \frac{(i_{in1} + i_{in2}) - id}{(i_{in1} + i_{in2})} = \left(\frac{R1 + R2}{R1 + R2 + \frac{1}{gm1} + \frac{1}{gm2}}\right) \quad (12)$$

This factor "r" can be kept close to 1 by choosing R1 and R2 as large as possible, and 1/gm1 and 1/gm2 as small as possible.

Figure 4:
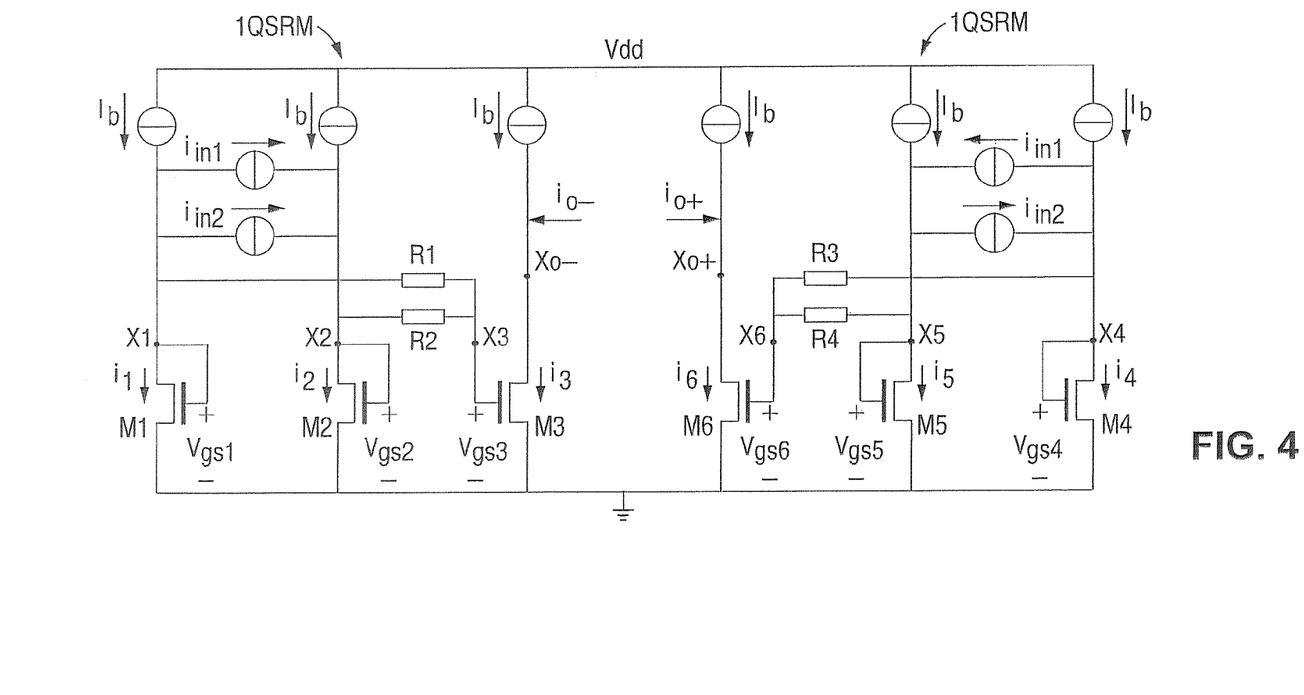
FIG. 4 diagrammatically illustrates a four quadrant square root current mode multiplier circuit according to exemplary embodiments of the invention.

A four quadrant multiplier (4QM) can be constructed with 2 versions of 1QSRM from FIG. 2. Exemplary embodiments of the resulting circuit 4QM are shown in FIG. 4. All MOS transistors operate in saturation according to the square law characteristic of the MOS transistor. Furthermore, all MOS transistors have the same aspect ratio.

The differential output current $i_{0+} - i_{O-}$, as seen at the output stage, equals:

$$i_{0+} - i_{0-} = \left(\frac{1}{2}\sqrt{(I_b - i_{in1} + i_{in2}) \cdot (I_b + i_{in1} - i_{in2})} - \frac{1}{2}\sqrt{(I_b - i_{in1} - i_{in2}) \cdot (I_b + i_{in1} + i_{in2})}\right) \quad (13)$$

The output current can be approximated by:

$$i_{0+} - i_{0-} \cong \frac{i_{in1} \cdot i_{in2}}{I_b} + \frac{i_{in1} \cdot i_{in2}^3}{2I_b^3} + \frac{i_{in1}^3 \cdot i_{in2}}{2I_b^3} + \frac{0(7)}{2} \quad (14)$$

In this equation (14), it is clear that the higher order unwanted terms can be minimized by increasing the bias current $I_b$.

The multiplier 4QM of FIG. 4 can be used at a very low supply voltage. In some embodiments, a minimum supply voltage of one gate-source voltage, e.g. $V_{gs1}$, at a current $2*I_b$ and one saturation voltage added for the current source $I_b$ is sufficient for proper operation.

The multiplexer 4QM of FIG. 4 can be scaled to operate at very high frequencies. In a high frequency application, such as a mixer, only nodes X1, X2, X4 and X5 have to operate at the highest frequency. The nodes X3, and X6, and the output nodes Xo+ and Xo− operate at the much lower difference frequency. This means that the output MOS transistors M3 and M6 can be scaled to maximize the low frequency output current. Furthermore, the bias current through MOS transistors M3 and M6 can be reduced, independently of MOS transistors M1, M2, M4 and M5.

Figure 5A:
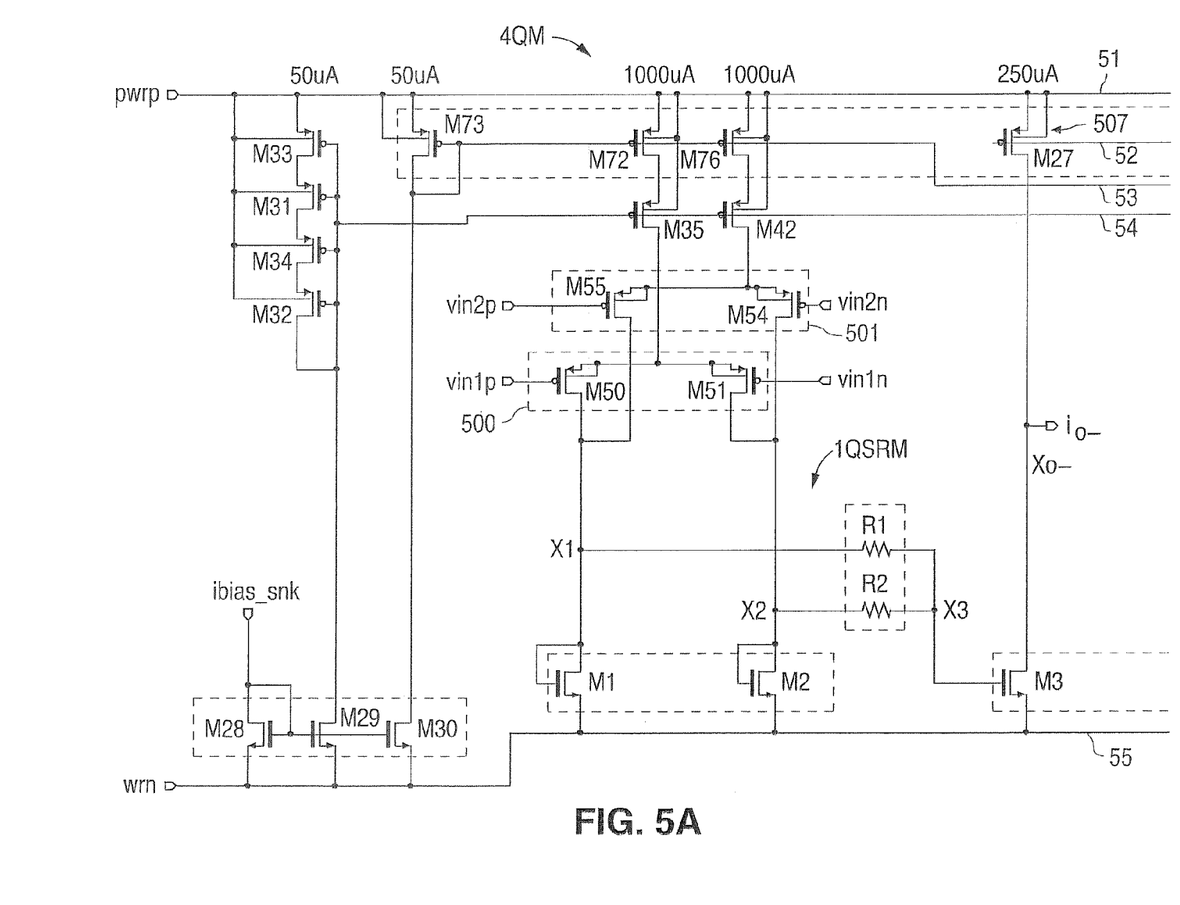
FIGS. 5A and 5B, taken together, illustrate a detailed implementation of the circuit of FIG. 4.

The four quadrant current mode multiplier 4QM can be used as a mixer. In a mixer, a high frequency input signal is converted to a low frequency output signal by multiplication with a signal at the difference frequency. FIGS. 5A-10 illustrate exemplary embodiments of a mixer application of the four quadrant current mode multiplier 4QM. Nodes that are common to both FIGS. 5A and 5B are designated therein as 51, 52, 53, 54 and 55.

A current of I(ibias_snk)=50 µA is applied at the input "ibias_snk" in FIG. 5A, feeding the current mirror formed by MOS transistors M28, M29 and M30. The output currents of M29 and M30 (50 µA) are fed to diode connected MOS transistors M73 and M31-M34. M73 in FIG. 5A forms a bias current mirror with MOS transistors M72, M76, M11 and M12 (see also FIG. 5B). The latter four MOS transistors are scaled up by a factor of 20 with respect to M73, and feed a 1mA bias current to the respectively corresponding differential pairs 500, 501, 502 and 503. MOS transistors M31-M34 generate a cascode bias voltage for cascode MOS transistors M35, M42, M40 and M41 (see also FIG. 5B). This keeps the MOS transistors of the bias current mirror in saturation and increases the output impedance of the bias current sources.

The differential pairs 501-504 (including MOS transistors M50, M51, M54, M55 and M36-M39) are used to convert the differential input voltages vin1p, vin1n and vin2p, vin2n to input currents (e.g. $i_{in1}$, and $i_{in2}$ of FIG. 4) appropriate for the current mode multiplier 4QM. In some embodiments, the small signal conversion transconductance is $gm_{in}$=6.8 mS.

Figure 5B:
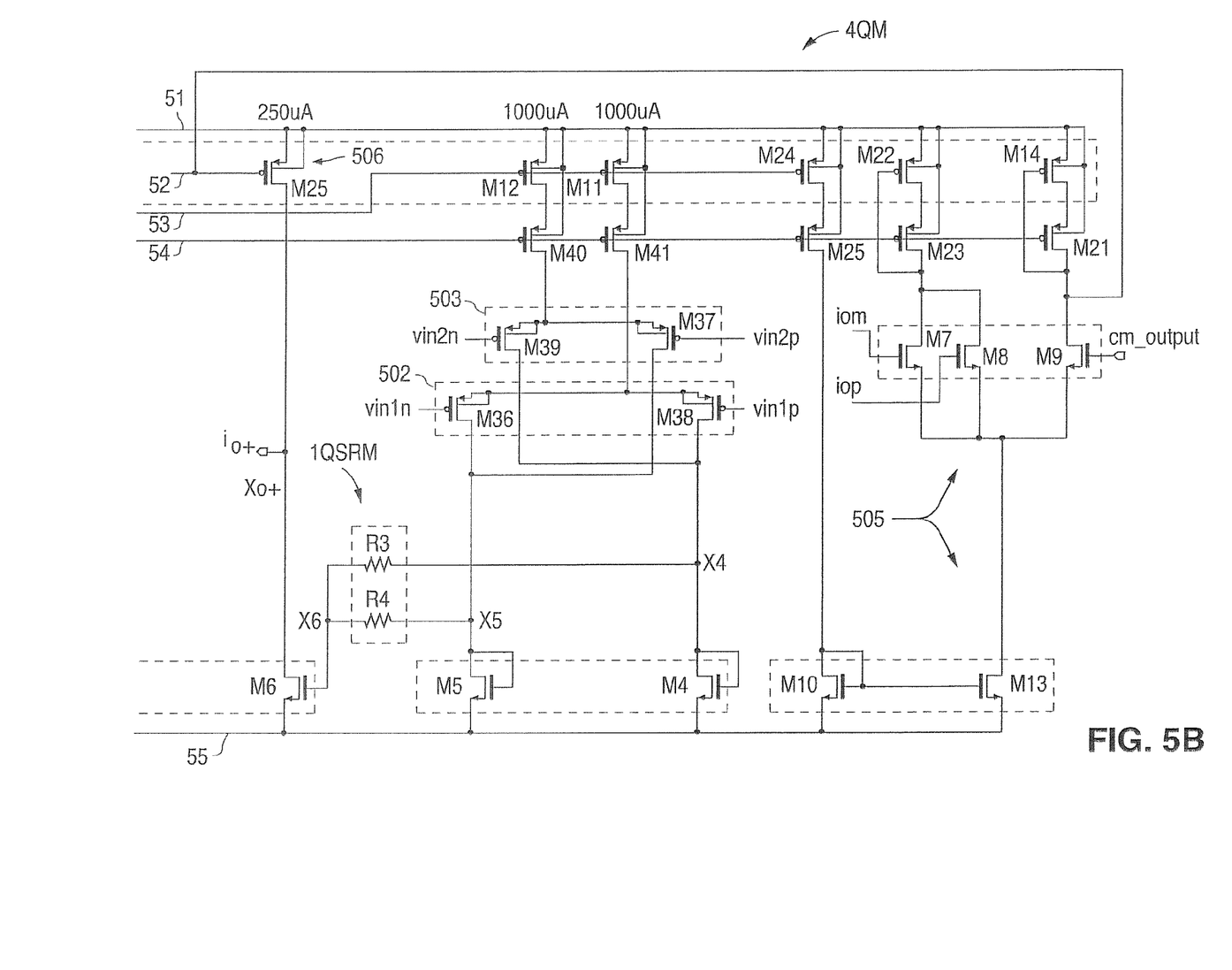

The MOS transistors of the circuits 1QSRM in FIGS. 5A and 5B are scaled in some embodiments to achieve high frequency performance. The output current includes a common mode part and a differential part. The signal output current $i_{O+}$, $i_{O-}$, as seen at the output stage, is differential. The unwanted common mode output current is compensated for by the common mode output regulation block 505. In block 505, the output common mode voltage is sensed with MOS transistor M7 and M8. Feedback is implemented through output current source MOS transistors 506 and 507. The output current through MOS transistors M3 and M6 is scaled down in some embodiments to a factor of ¼. The multiplier equation (14) will then be realized by the approximation:

$$i_{0+} - i_{0-} \cong \frac{i_{in1} \cdot i_{in2}}{4 I_b} \quad (15)$$

Figure 6:
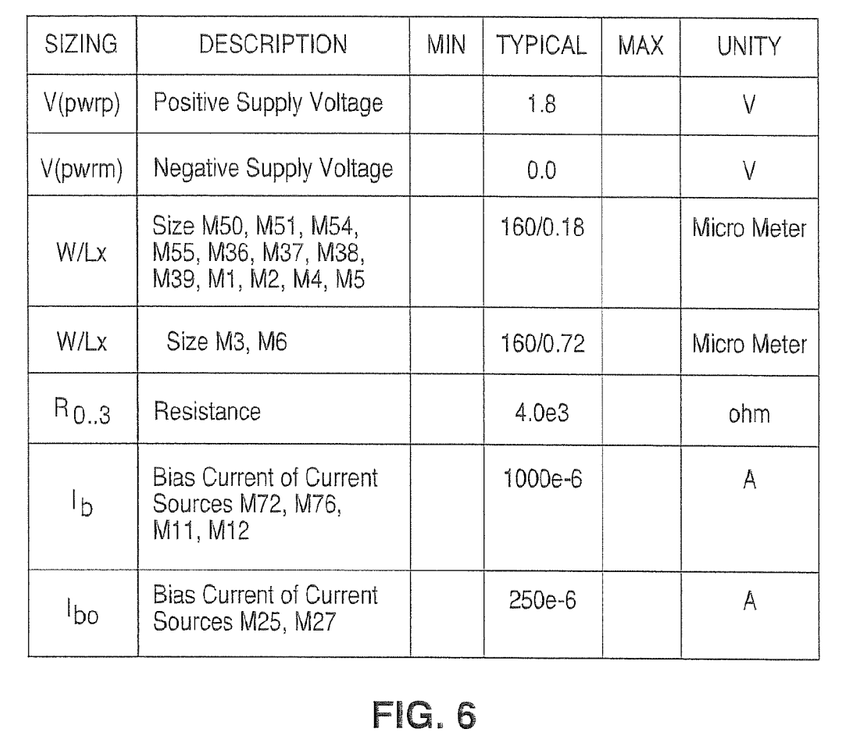
FIG. 6 illustrates in tabular format selected characteristics of various components illustrated in FIGS. 5A and 5B.

Selected components of the multiplier 4QM of FIGS. 5A and 5B are scaled according to FIG. 6 in some embodiments.

Figure 7A:
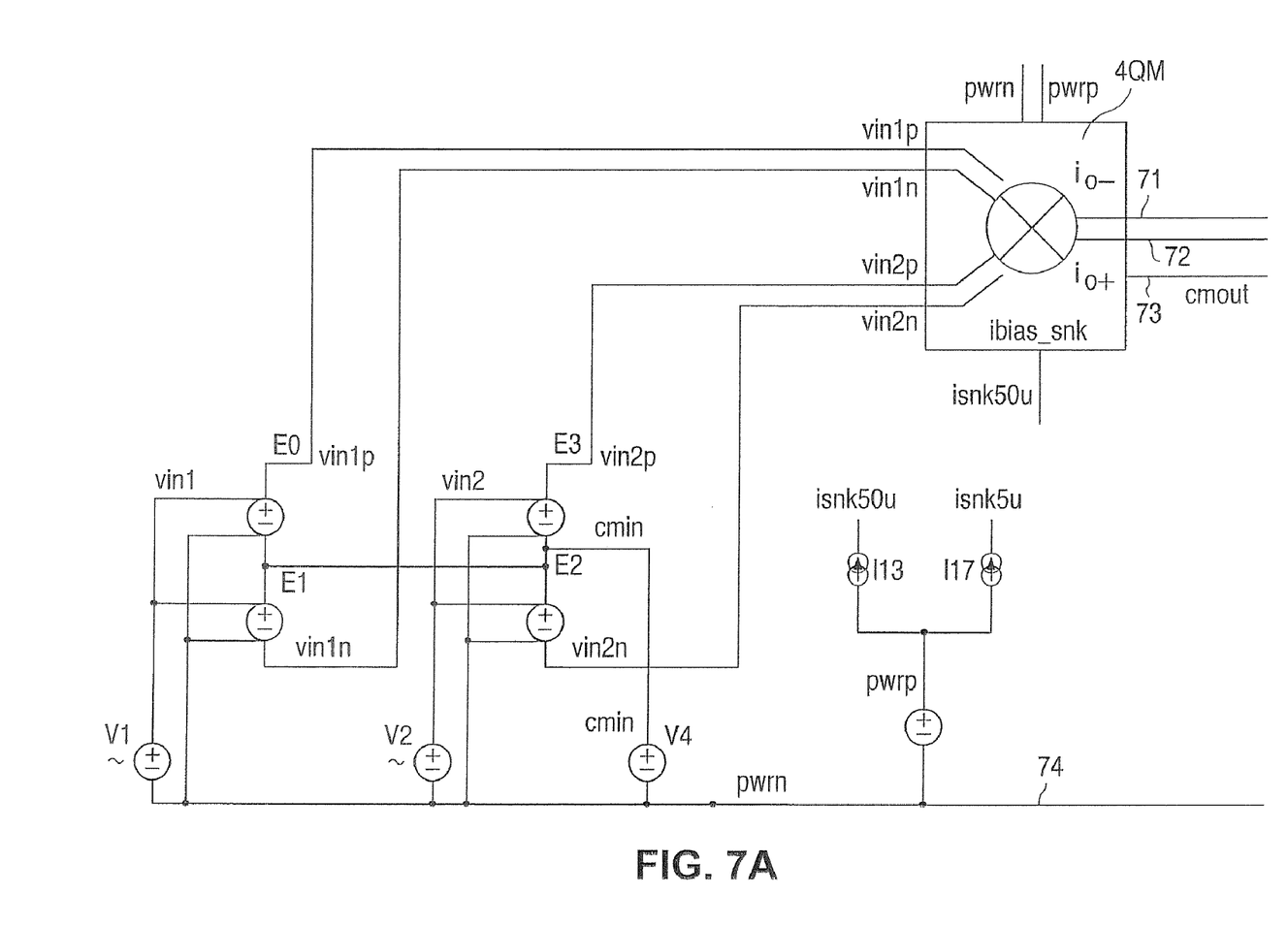
FIGS. 7A and 7B, taken together, diagrammatically illustrate a mixer according to exemplary embodiments of the invention.
Figure 7B:
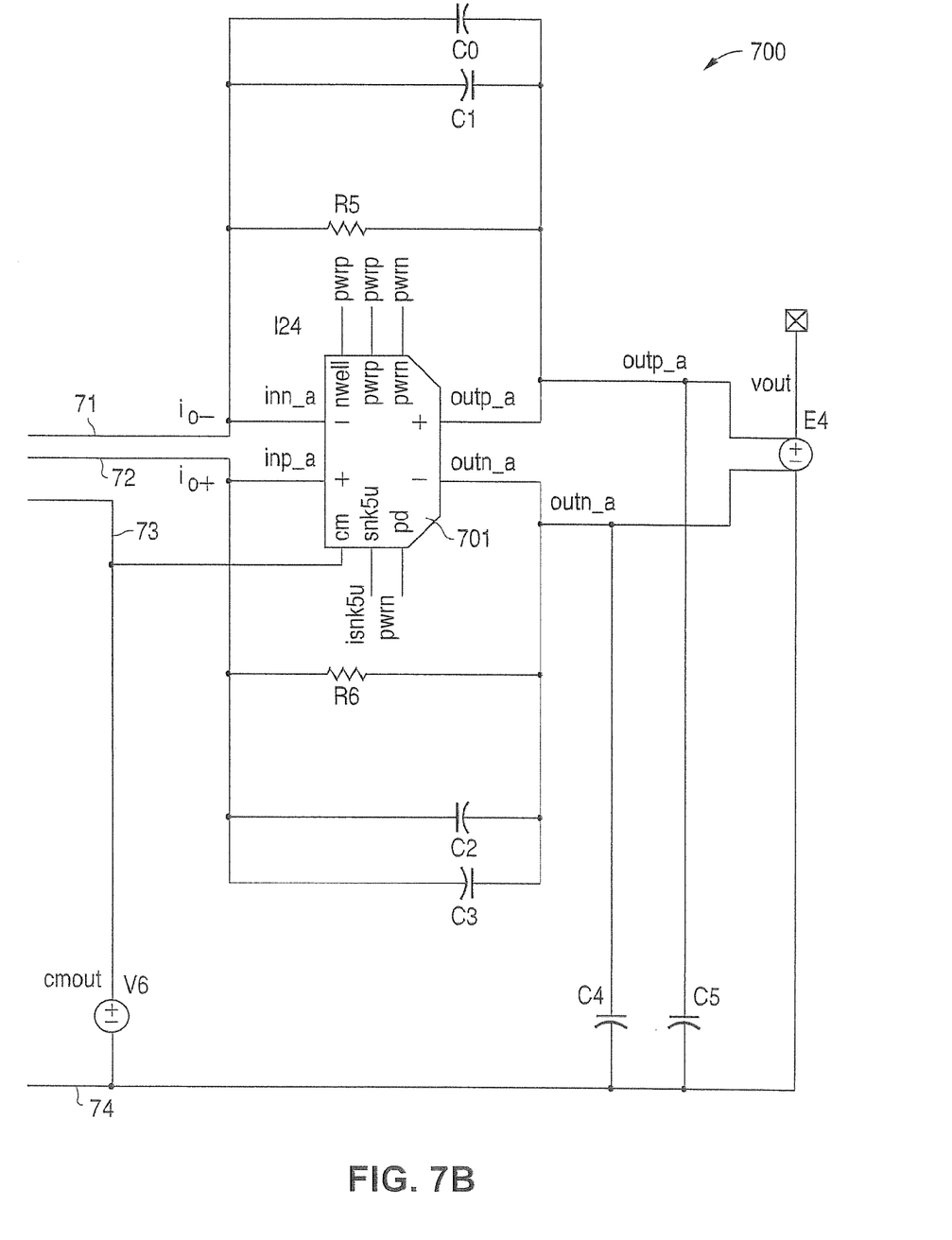

Referring to the exemplary mixer embodiments of FIGS. 7A and 7B, nodes common to FIGS. 7A and 7B are shown therein as 71, 72, 73 and 74. Voltage sources V1 and V2 generate high frequency input signals. The voltage controlled voltage sources E0 to E3 convert the single ended input voltages vin1 and vin2 into differential voltages vin1p,vin1n and vin2p,vin2n. These are applied to the multiplier 4QM. The common mode input voltage cmin is generated for voltage sources E0-E3 by DC voltage source V4.

Figure 8:
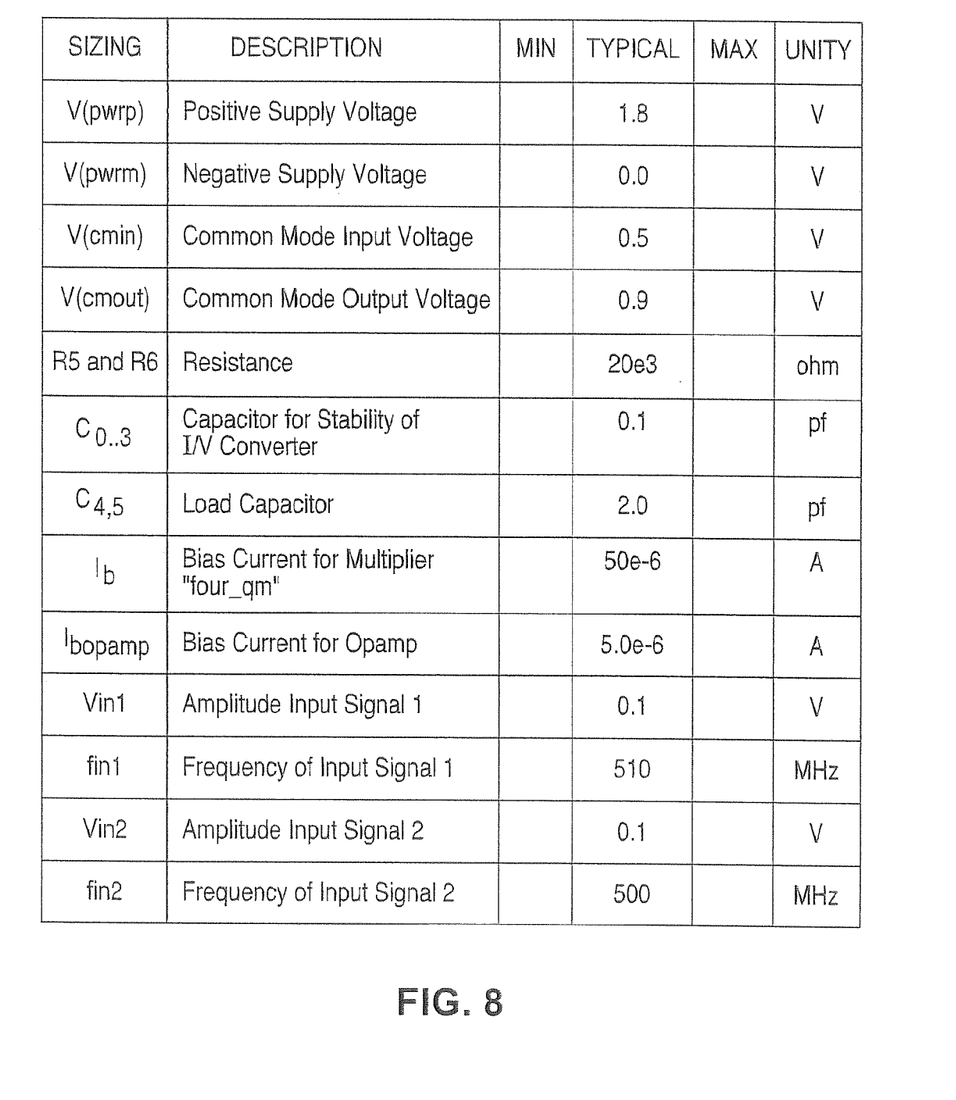
FIG. 8 illustrates in tabular format selected characteristics of various components illustrated in FIGS. 7A and 7B.

The wanted differential current output signal $i_{o+}$, $i_{o-}$, out of multiplier 4QM is fed to an output stage that includes a current-to-voltage converter (I/V converter) 700 built around opamp 701 (see also FIG. 7B). In some embodiments, the conversion resistors are R5=R6=20 kohm, and C0-C3 are 0.1 pF capacitors used to assure the stability of the I/V converter. Capacitors C4 and C5 are shown to represent load capacitance of the I/V converter. FIG. 8 shows the sizing of selected components in FIGS. 7A and 7B according to some embodiments.

When two input signals according to FIG. 8 (vin1 at fin1 and vin2 at fin2) are applied to the multiplier, the differential output signal has ideally two frequency components, the sum and difference frequencies of the input signals, 1.01 GHz and 10 MHz respectively. The output signal at 10 MHz is the wanted component. The component at 1.01 GHz is filtered. Referring also to FIGS. 5A and 5B, filtering time constants are formed by parallel resistance pairs R1 and R2 (R3 and R4) and the gate-source capacitance of the corresponding output MOS transistor M3(M6). Further filtering is achieved by the I/V converter which in some embodiments has a bandwidth of 40 MHz.

Figure 9:
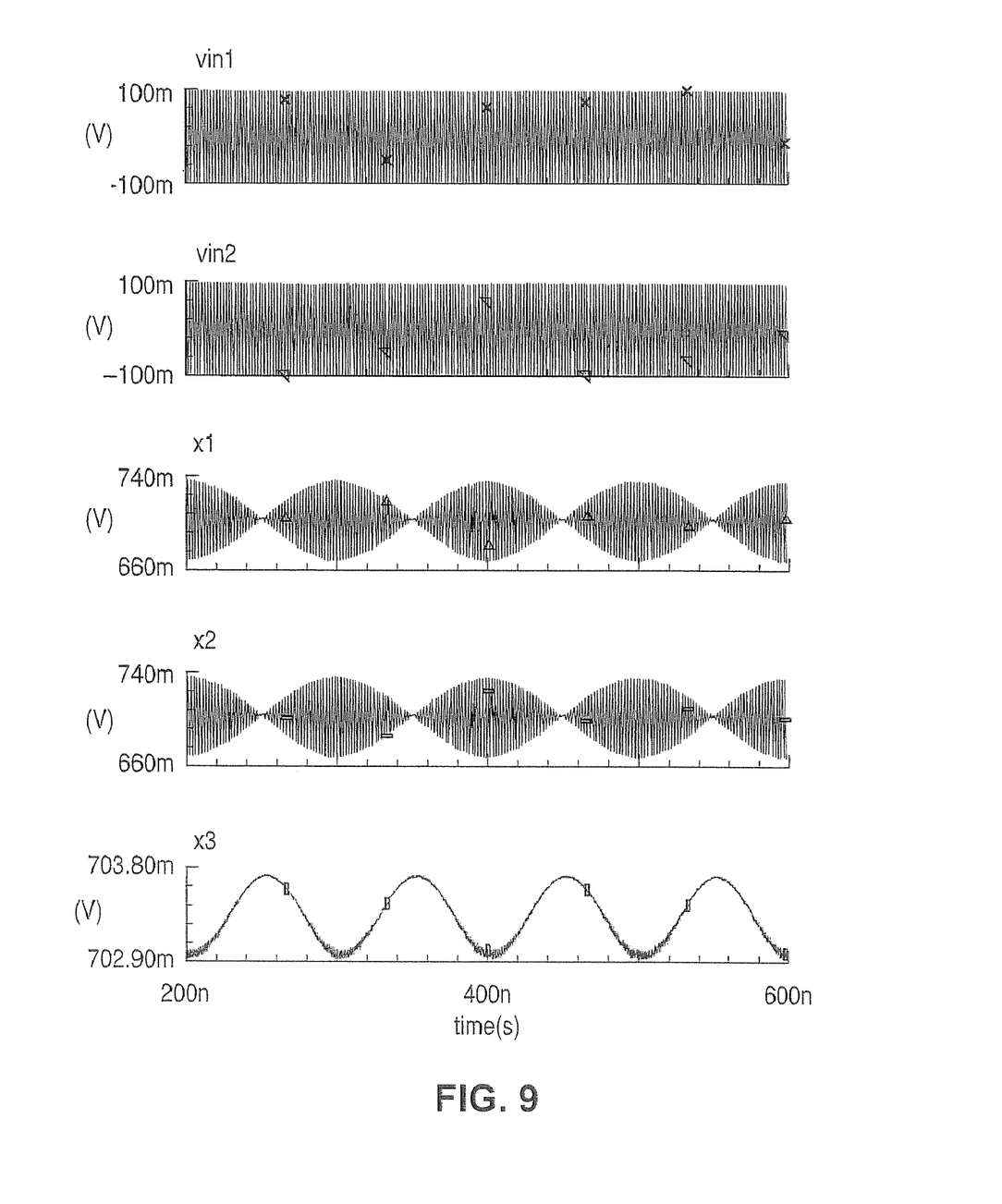
FIGS. 9 and 10 graphically illustrate selected signals from FIGS. 5A, 5B, 7A and 7B.
Figure 10:
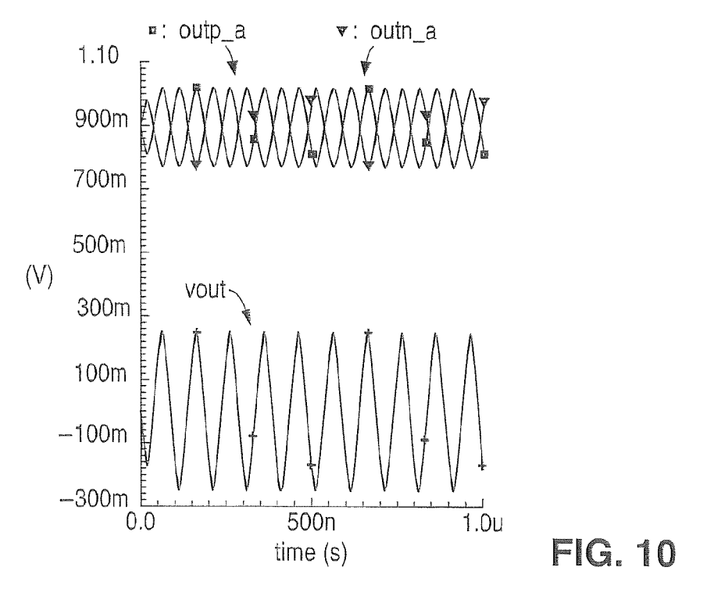

FIGS. 9 and 10 show selected signals from FIGS. 5A, 5B, 7A and 7B. The high frequency input signals vin1, vin2 (FIG. 7A) and the internal multiplier node voltages on x1, x2 and x3 (FIG. 5A) are shown in FIG. 9. This shows that the multiplier compresses the input signals. The low ohmic nodes x1 (x4) and x2 (x5) make the circuit suitable for high frequency operation. On node x3 (x6), the low frequency signal component at 10 MHz is obvious. This indicates that node x3 (x6) is already a "low frequency" node. Due to scaling of the output MOS transistors M3 and M6 in some embodiments, the gate-source capacitances of these MOS transistors already filters most of the high frequency signal content on node x3 (x6).

FIG. 10 shows the voltage on nodes vout and outp_a and outn_a of FIG. 7B. The differential output voltage vout=outp_a−outn_a has a frequency of 10 MHz, showing the mixing performance of the circuit. The amplitude of the output signal vout is 0.25V.

Although the present invention has been described with exemplary embodiments, various changes and modifications may be suggested to one skilled in the art. It is intended that the present invention encompass such changes and modifications as fall within the scope of the appended claims.

What is claimed is:

1. A current mode multiplier circuit, comprising:
   first, second and third MOS transistors having a common aspect ratio;
   first and second current sources that respectively provide first and second input currents which respectively represent first and second factors to be multiplied;
   said first and second MOS transistors each coupled to said first and second current sources, said first MOS transistor producing a first voltage as a function of said first and second input currents, and said second MOS transistor producing a second voltage as a function of said first and second input currents;
   said third MOS transistor coupled to said first and second MOS transistors for producing a third current as a function of said first and second voltages; and
   an output stage coupled to said third MOS transistor, said output stage producing in response to said third current a product signal that represents a product of said first and second factors.

2. The circuit of claim 1, including fourth, fifth and sixth MOS transistors having said common aspect ratio, each of said fourth and fifth MOS transistors coupled to said first and second current sources, said fourth MOS transistor producing a third voltage as a function of said first and second input currents, and said fifth MOS transistor producing a fourth voltage as a function of said first and second input currents, said sixth MOS transistor coupled to said fourth and fifth MOS transistors for producing a fourth current as a function of said third and fourth voltages, said output stage coupled to said sixth MOS transistor, and said output stage producing said product signal in response to said third and fourth currents.

3. The circuit of claim 2, wherein said product signal is a differential current signal derived from said third and fourth currents.

4. The circuit of claim 2, wherein each of said first, second, fourth and fifth MOS transistors has a gate thereof connected to a drain thereof.

5. The circuit of claim 2, including a third current source coupled to said MOS transistors and providing an operating current for said MOS transistors, said first, second and third current sources cooperable to produce respective current flows in said first, second, fourth and fifth MOS transistors, said current flows in said first and second MOS transistors produced by combining said operating current with a sum of said first and second currents, and said current flows in said fourth and fifth MOS transistors produced by combining said operating current with a difference of said first and second currents.

6. The circuit of claim 5, wherein said current flow in said first MOS transistor is produced as a difference between said operating current and said sum of said first and second currents, said current flow in said second MOS transistor is produced as a sum of said operating current and said sum of said first and second currents, said current flow in said fourth MOS transistor is produced as a difference between said second current and a sum of said operating current and said first current, and said current flow in said fifth MOS transistor is produced as a difference between said first current and a sum of said operating current and said second current.

7. The circuit of claim 6, including a first voltage averager coupled between a gate of said third MOS transistor and said first and second MOS transistors, said first voltage averager providing at said gate of said third MOS transistor a first averaged voltage which is an average of said first and second voltages, and including a second voltage averager coupled between a gate of said sixth MOS transistor and said fourth and fifth MOS transistors, said second voltage averager providing at said gate of said sixth MOS transistor a second averaged voltage which is an average of said third and fourth voltages.

8. The circuit of claim 7, wherein said first voltage averager includes first and second resistors respectively coupled to said first and second MOS transistors and also coupled to said gate of said third MOS transistor, and wherein said second voltage averager includes third and fourth resistors respectively coupled to said fourth and fifth MOS transistors and also coupled to said gate of said sixth MOS transistor.

9. The circuit of claim 5, including a first voltage averager coupled between a gate of said third MOS transistor and said first and second MOS transistors, said first voltage averager providing at said gate of said third MOS transistor a first averaged voltage which is an average of said first and second voltages, and including a second voltage averager coupled between a gate of said sixth MOS transistor and said fourth and fifth MOS transistors, said second voltage averager providing at said gate of said sixth MOS transistor a second averaged voltage which is an average of said third and fourth voltages.

10. The circuit of claim 2, including a first voltage averager coupled between a gate of said third MOS transistor and said first and second MOS transistors, said first voltage averager providing at said gate of said third MOS transistor a first averaged voltage which is an average of said first and second voltages, and including a second voltage averager coupled between a gate of said sixth MOS transistor and said fourth and fifth MOS transistors, said second voltage averager providing at said gate of said sixth MOS transistor a second averaged voltage which is an average of said third and fourth voltages.

11. The circuit of claim 2, wherein said output stage includes a differential current-to-voltage converter for producing a differential voltage signal in response to said third and fourth currents.

12. The circuit of claim 1, including a voltage averager coupled between a gate of said third MOS transistor and said first and second MOS transistors, said voltage averager providing at said gate of said third MOS transistor a third voltage which is an average of said first and second voltages.

13. The circuit of claim 12, wherein said voltage averager includes first and second resistors respectively coupled to said first and second MOS transistors and also coupled to said gate of said third MOS transistor.

14. The circuit of claim 1, wherein each of said first and second MOS transistors has a gate thereof connected to a drain thereof.

15. A mixer for converting an input signal having a first frequency to an output signal having a second frequency lower than said first frequency by multiplying said input signal with a further signal having a third frequency that is a difference between said first and said second frequencies, comprising:

first, second, third, fourth, fifth and sixth MOS transistors having a common aspect ratio;

first and second current sources that respectively provide first and second input currents which respectively represent said input signal and said further signal;

said first and second MOS transistors each coupled to said first and second current sources, said first MOS transistor producing a first voltage as a function of said first and second input currents, and said second MOS transistor producing a second voltage as a function of said first and second input currents;

said third MOS transistor coupled to said first and second MOS transistors for producing a third current as a function of said first and second voltages;

said fourth and fifth MOS transistors each coupled to said first and second current sources, said fourth MOS transistor producing a third voltage as a function of said first and second input currents, and said fifth MOS transistor producing a fourth voltage as a function of said first and second input currents;

said sixth MOS transistor coupled to said fourth and fifth MOS transistors for producing a fourth current as a function of said third and fourth voltages; and a differential current-to-voltage converter coupled to said third and sixth MOS transistors for producing in response to said third and fourth currents a differential voltage signal that represents said output signal.

16. The mixer of claim 15, including a third current source coupled to said MOS transistor and providing an operating current for said MOS transistors, said first, second and third current sources cooperable to produce respective current flows in said first, second, fourth and fifth MOS transistors, said current flows in said first and second MOS transistors produced by combining said operating current with a sum of said first and second currents, and said current flows in said fourth and fifth MOS transistors produced by combining said operating current with a difference of said first and second currents.

17. The mixer of claim 15, including a first voltage averager coupled between a gate of said third MOS transistor and said first and second MOS transistors, said first voltage averager providing at said gate of said third MOS transistor a first averaged voltage which is an average of said first and second voltages, and including a second voltage averager coupled between a gate of said sixth MOS transistor and said fourth and fifth MOS transistors, said second voltage averager providing at said gate of said sixth MOS transistor a second averaged voltage which is an average of said third and fourth voltages.

18. The mixer of claim 15, wherein each of said first, second, fourth and fifth MOS transistors has a gate thereof connected to a drain thereof.

19. A method of performing current node multiplication with a plurality of MOS transistors having a common aspect ratio, comprising:

providing first and second input currents which respectively represent first and second factors to be multiplied;

producing a first voltage on a first of said MOS transistors as a function of said first and second input currents;

producing a second voltage on a second of said MOS transistors as a function of said first and second input currents;

in a third of said MOS transistors, producing a third current as a function of said first and second voltages; and producing in response to said third current a product signal that represents a product of said first and second factors.

20. The method of claim 19, including producing on a fourth of said MOS transistors a third voltage as a function of said first and second input currents, producing on a fifth of said MOS transistors a fourth voltage as a function of said first and second input currents, and further including, in a sixth of said MOS transistors, producing a fourth current as a function of said third and fourth voltages, and said product signal producing step including producing said product signal in response to said third and fourth currents.

* * * * *

UNITED STATES PATENT AND TRADEMARK OFFICE
CERTIFICATE OF CORRECTION

PATENT NO. : 7,400,184 B2  
APPLICATION NO. : 11/112581  
DATED : July 15, 2008  
INVENTOR(S) : Manjo Nijrolder Page 1 of 1

It is certified that error appears in the above-identified patent and that said Letters Patent is hereby corrected as shown below:

Column 4, replace equation (14) with:

$$-- \; i_{0+} - i_{0-} \cong \frac{i_{in1} \cdot i_{in2}}{I_b} + \frac{i_{in1} \cdot i_{in2}^3}{2I_b^3} + \frac{i_{in1}^3 \cdot i_{in2}}{2I_b^3} + \frac{0(7)}{2} \;\; --;$$

Column 5, line 19, delete "50 μA" and replace with -- 50uA --;

Column 5, line 22, delete "(50 μA)" and replace with -- (50uA) --;

Column 5, line 44, delete "$i_Q$" and replace with -- $i_{0-}$ --.

Signed and Sealed this

Eighteenth Day of November, 2008

JON W. DUDAS  
*Director of the United States Patent and Trademark Office*